(12) United States Patent
Cho et al.

(10) Patent No.: US 10,026,844 B2
(45) Date of Patent: Jul. 17, 2018

(54) ELECTRONIC DEVICE AND METHOD FOR FABRICATING THE SAME

(71) Applicant: ELECTRONICS AND TELECOMMUNICATIONS RESEARCH INSTITUTE, Daejeon (KR)

(72) Inventors: Kyoung Ik Cho, Daejeon (KR); Jae Bon Koo, Daejeon (KR); Chan Woo Park, Daejeon (KR); Bock Soon Na, Daejeon (KR); Sang Seok Lee, Sejong (KR); Sang Chul Lim, Daejeon (KR); Soon-Won Jung, Daejeon (KR); Hye Yong Chu, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/461,567

(22) Filed: Mar. 17, 2017

(65) Prior Publication Data
US 2017/0186876 A1  Jun. 29, 2017

Related U.S. Application Data

(62) Division of application No. 14/610,410, filed on Jan. 30, 2015, now Pat. No. 9,634,120.

(30) Foreign Application Priority Data

May 30, 2014 (KR) ........................ 10-2014-0065804

(51) Int. Cl.
*H01L 29/10* (2006.01)
*H01L 29/786* (2006.01)
(Continued)

(52) U.S. Cl.
CPC .... *H01L 29/78603* (2013.01); *H01L 21/3105* (2013.01); *H01L 21/31058* (2013.01);
(Continued)

(58) Field of Classification Search
CPC ........... H01L 21/3105; H01L 21/31058; H01L 21/31144; H01L 29/66742; H01L 29/78603; H01L 51/0097
See application file for complete search history.

(56) References Cited

U.S. PATENT DOCUMENTS 7,691,307 B2   4/2010  Fearing et al.
8,245,393 B2   8/2012  Hong et al.
(Continued)

FOREIGN PATENT DOCUMENTS

KR   2010-0018006 A   2/2010

OTHER PUBLICATIONS

David E. Clark, et al., "Microwave Processing of Materials", Annual Reviews, vol. 26, pp. 299-331, 1996.

*Primary Examiner* — Joseph C Nicely
*Assistant Examiner* — Tuan A Hoang
(74) *Attorney, Agent, or Firm* — Rabin & Berdo, P.C.

(57) ABSTRACT

Provided is a method for fabricating an electronic device, the method including: preparing a carrier substrate including an element region and a wiring region; forming a sacrificial layer on the carrier substrate; forming an electronic element on the sacrificial layer of the element region; forming a first elastic layer having a corrugated surface on the first elastic layer of the wiring region; forming a metal wirings electrically connecting the electronic element thereto, on the first elastic layer of the wiring region; forming a second elastic layer covering the metal wirings, on the first elastic layer; forming a high rigidity pattern filling in a recess of the second elastic layer above the electronic element so as to (Continued)

overlap the electronic element, and having a corrugated surface; forming a third elastic layer on the second elastic layer and the high rigidity pattern; and separating the carrier substrate.

9 Claims, 10 Drawing Sheets (51) Int. Cl.
*H01L 29/66* (2006.01)
*H01L 27/12* (2006.01)
*H01L 21/3105* (2006.01)
*H01L 21/311* (2006.01)

(52) U.S. Cl.
CPC .... *H01L 21/31144* (2013.01); *H01L 27/1218* (2013.01); *H01L 27/1266* (2013.01); *H01L 29/66742* (2013.01)

(56) References Cited

U.S. PATENT DOCUMENTS

| | | |
|---|---|---|
| 8,404,532 B2 | 3/2013 | Koo et al. |
| 2010/0035182 A1 | 2/2010 | Tanaka et al. |
| 2014/0055702 A1 | 2/2014 | Park et al. |
| 2014/0183473 A1 | 7/2014 | Lee et al. |
| 2014/0240932 A1* | 8/2014 | Hsu ................ H05K 1/189 361/749 |
| 2014/0375465 A1 | 12/2014 | Fenuccio et al. |
| 2015/0084207 A1 | 3/2015 | Chauhan et al. |

\* cited by examiner

ELECTRONIC DEVICE AND METHOD FOR FABRICATING THE SAME

CROSS-REFERENCE TO RELATED APPLICATIONS

This is a divisional application of U.S. patent application Ser. No. 14/610,410, filed on Jan. 30, 2015, and allowed on Feb. 10, 2017. Further, this patent application also claims priority under 35 U.S.C. §119 of Korean Patent Application No. 10-2014-0065804, filed on May 30, 2014. The entire contents of these prior applications are hereby incorporated by reference.

BACKGROUND OF THE INVENTION

The present invention disclosed herein relates to an electronic device and a method for fabricating the same, and more particularly, to a stretchable electronic device and a method for fabricating the same.

A stretchable electronic device, capable of maintaining an electric function even when a substrate is stretched by external force, surpasses the limits of the conventional flexible devices that is only bendable, and has potential applications in various fields, such as robotics, wearable devices, on/in-body bio-device elements, next-generation displays, or the like. Therefore, various studies have been conducted so as to implement the stretchable device.

Methods for fabricating an electronic device using a stretchable substrate may be classified into two major methods. The first method includes fabricating an electronic device on a silicone substrate or a glass substrate capable of performing high temperature processes, and then transferring the electronic device onto the stretchable substrate. The second method includes directly fabricating an electronic device on the stretchable substrate.

Meanwhile, since materials constituting the electronic device are hard and easily broken, they hardly have the ability to expand against external force. Therefore, in order to implement a stretchable electronic device, a method for making only metal wirings connecting an electronic element to be formed in an extensible structure has been mainly used.

SUMMARY OF THE INVENTION

The present invention provides a stretchable electronic device having high performance and improved stretchable stability.

The present invention also provides a method for fabricating a stretchable electronic device having high performance and improved stretchable stability.

Embodiments of the present invention provide electronic devices comprising: an elastic substrate including an element region and a wiring region; an electronic element on the elastic substrate of the element region; a first elastic layer disposed on the elastic substrate and having a corrugated surface at the wiring region; metal wirings disposed along the corrugated surface of the first elastic layer of the wiring region and electrically connecting the electronic element thereto; a second elastic layer disposed on the first elastic layer to cover the metal wirings; a high rigidity pattern recessed into the second elastic layer above the electronic element so as to vertically overlap the electronic element, and having a corrugated surface; and a third elastic layer disposed on the high rigidity pattern and the second elastic layer.

In some embodiments, the first elastic layer, the second elastic layer, the third elastic layer and the elastic substrate may be formed of a same material.

In other embodiments, a width of the high rigidity pattern may be wider than that of the electronic element.

In still other embodiments, a material constituting the high rigidity pattern may have a higher Young's modulus than a material constituting the first elastic layer, the second elastic layer, the third elastic layer or the elastic substrate.

In even other embodiments, a material constituting the high rigidity pattern may be a polyimide.

In yet other embodiments, the second elastic layer is formed of a photosensitive elastic material and the high rigidity pattern may be of the photosensitive elastic material cured by light.

In other embodiments of the present invention, methods for fabricating an electronic device, the method comprising: preparing a carrier substrate including an element region and a wiring region; forming a sacrificial layer on the carrier substrate; forming an electronic element on the sacrificial layer of the element region; forming a first elastic layer having a corrugated surface on the sacrificial layer of the wiring region; forming metal wirings electrically connecting the electronic element thereto on the first elastic layer of the wiring region; forming a second elastic layer covering the metal wirings, on the first elastic layer; forming a high rigidity pattern recessed into the second elastic layer above the electronic element so as to vertically overlap the electronic element, and having a corrugated surface; forming a third elastic layer on the second elastic layer and the high rigidity pattern; and separating the carrier substrate.

In some embodiments, the forming of the first elastic layer may comprise: applying an elastic material on the sacrificial layer so as to cover the electronic element; and making a surface of the elastic material corrugated.

In other embodiments, the forming of the high rigidity pattern may comprise: etching the second elastic layer of the element region and a part of the second elastic layer of the wiring region adjacent to the element region; filling the etched region of the second elastic layer with a high rigidity material; and making a surface of the high rigidity material corrugated.

In still other embodiments, the second elastic layer may be formed of a photosensitive elastic material.

In even other embodiments, the forming of the high rigidity pattern may comprise: forming a mask pattern exposing the second elastic layer of the element region and a part of the second elastic layer of the wiring region adjacent to the element region, on the second elastic layer; irradiating light on the second elastic layer exposed by the mask pattern; and making a surface of the second elastic layer exposed to light corrugated.

In yet other embodiments, the forming of the high rigidity pattern may include: making a surface of the second elastic layer corrugated; forming a mask pattern exposing the second elastic layer of the element region and a part of element region of the wiring region adjacent to the element region, on the second elastic layer; and irradiating light on the second elastic layer exposed by the mask pattern.

In further embodiments, a width of the high rigidity pattern may be wider than that of the electronic element.

In still further embodiments, the separating of the carrier substrate may be performed by using any one selected from a high-frequency heating process, a laser heating process, a chemical process or a physical process.

In even further embodiments, the method may further comprise forming an elastic substrate on the electronic element and the first elastic layer that are exposed after separating the carrier substrate.

In still other embodiments of the present invention, methods for fabricating an electronic device, the method comprising: preparing a carrier substrate including an element region and a wiring region; forming a sacrificial layer on the carrier substrate; forming an electronic element on the sacrificial layer of the element region; corrugating a surface of the sacrificial layer of the wiring region; forming metal wirings electrically connecting the electronic element thereto, on the sacrificial layer of the wiring region; forming a second elastic layer covering the metal wirings on the sacrificial layer; forming a high rigidity pattern recessed into the second elastic layer above the electronic element so as to vertically overlap the electronic element, and having a corrugated surface; forming a third elastic layer on the second elastic layer and the high rigidity pattern; and separating the carrier substrate.

In some embodiments, a width of the high rigidity pattern may be wider than that of the electronic element.

In other embodiments, the method may further comprise forming an elastic substrate on the electronic element and the sacrificial layer that are exposed after separating the carrier substrate.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Like reference numerals refer to like elements throughout.

Hereinafter, it will be described about an exemplary embodiment of the present invention in conjunction with the accompanying drawings. The terms of a singular form may include plural forms unless referred to the contrary. The meaning of "include," " comprise," " including," or " comprising," specifies a property, a region, a fixed number, a step, a process, an element and/or a component but does not exclude other properties, regions, fixed numbers, steps, processes, elements and/or components.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. For example, an etched region illustrated as a rectangle may have rounded or curved features. Areas exemplified in the drawings have general properties, and are used to illustrate a specific shape of a semiconductor package region. Thus, this should not be construed as limited to the scope of the present invention.

Hereinafter, a method for fabricating an electronic device according to an embodiment of the present invention will be described with reference to FIGS. 1 to 16.

Figure 1:
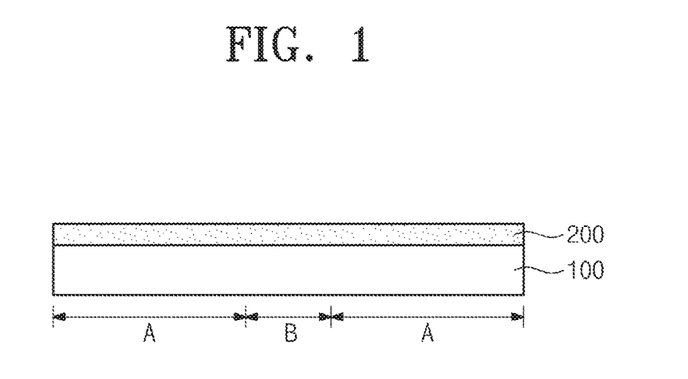
FIGS. 1 to 20 are cross-sectional views illustrating a method for fabricating an electronic device according to embodiments of the present invention.

Referring to FIG. 1, a carrier substrate 100 may include a wiring region A and an element region B. The carrier substrate 100 may be a silicon substrate or a glass substrate.

Also, a sacrificial layer 200 may be formed on the carrier substrate 100. The sacrificial layer 200 may have a flat upper surface. The sacrificial layer 200 may function as a buffer film for fabricating an electronic element (reference numeral 300 in FIG. 2) and as a sacrificial film when separating the carrier substrate 100 in a subsequent process. In order for the sacrificial layer 200 to function as the buffer film, the sacrificial layer 200 should be stable during the fabrication of the electronic device, provide a surface as flat as possible, and suppress diffusion of impurities from the carrier substrate 100 to the electronic element (reference numeral 300 in FIG. 2). As an example, the sacrificial layer 200 may be formed of any one of an oxide film, a nitride film, amorphous silicon, or a polyimide. In order for the sacrificial layer 200 to function as a sacrificial film, the carrier substrate 100 should be easily separated in a subsequent process. As an example, the sacrificial layer 200 may be formed of any one of amorphous silicon, an oxide ceramic, a nitride ceramic, a polymeric material, or a material having weak adhesion to the carrier substrate 100. The sacrificial layer 200 may be not a single layer but have a structure in which a sacrificial film and a buffer film are sequentially stacked on the carrier substrate 100.

Figure 2:
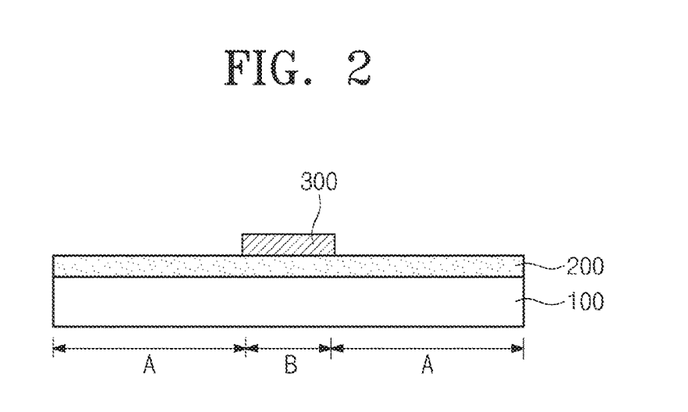

Referring to FIG. 2, an electronic element 300 may be formed on the sacrificial layer 200 of the element region B. As an example, the electronic element 300 may be a thin film transistor. Since the electronic element 300 is fabricated on the carrier substrate 100 capable of performing a high temperature process, the electronic element 300 may be fabricated through a typical high temperature process.

Figure 3:
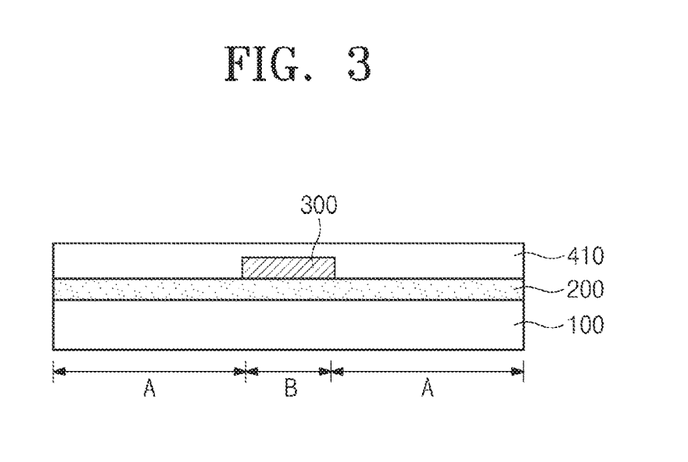
Figure 4:
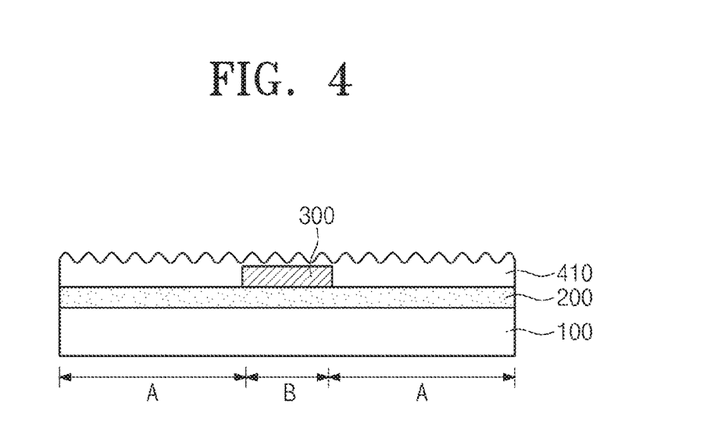

Referring to FIGS. 3 and 4, a first elastic layer 410 having a corrugated surface at the wiring region A may be formed on the sacrificial layer 200. The first elastic layer 410 may cover the electronic element 300 but be formed as thin as possible such that a portion connecting the electronic element 300 and a metal line 500 to be described later is exposed. For convenience of a process, the first elastic layer 410 at the element region B may also have a corrugated surface. Corrugated portions are distributed in all directions in a flat view, an interval or a depth of the corrugated portions may be adjusted by changing a photomask pattern or a process condition used in a process of forming corrugated portions. The first elastic layer 410 may be formed of a stretchable elastic material. As an example, the first elastic layer 410 may be formed of polydimethylsiloxane (PDMS) or polyurethane.

The forming of the first elastic layer 410 having the corrugated surface at the wiring region A may include applying an elastic material on the sacrificial layer 200 to form the first elastic layer 410 (FIG. 3) and making a surface of the first elastic layer 410 corrugated (FIG. 4). As an example, the forming of the corrugated surface at the wiring region A of the first elastic layer 410 may include forming a photoresist film on an entire surface of the first elastic layer 410, performing a photolithographic process on the photoresist film to form a photoresist pattern that exposes a portion of the first elastic layer 410 of the wiring region A, and etching of the first elastic layer 410 to form grooves in the first elastic layer 410 of the wiring region A. As another example, the forming of the corrugated surface at the wiring region A of the first elastic layer 410 may include forming the first elastic layer 410 of a photosensitive elastic material (for example, a photosensitive PDMS), and forming grooves on the first elastic layer 410 of the wiring region A through the photolithographic process by using a photomask exposing a portion of the first elastic layer 410. As still another example, the corrugated surface may be formed at the wiring region A of the first elastic layer 410 by using an imprint process.

Figure 5:
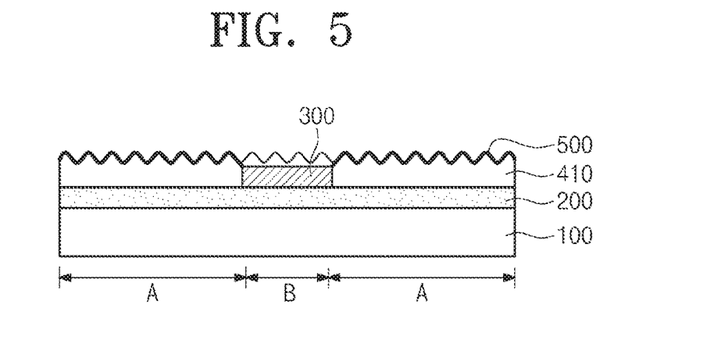

Referring to FIG. 5, metal wirings 500 may be formed on the first elastic layer 410 of the wiring region A. The metal wirings 500 may be conformally formed on the corrugated surface of the first elastic layer 410 without a void. The metal wirings 500 may electrically connect the electronic element 300 thereto. An adhesive layer (not shown) may be further formed between the metal wirings 500 and the first elastic layer 410 so as to improve adhesive force between the metal wirings 500 and the first elastic layer 410.

Figure 6:
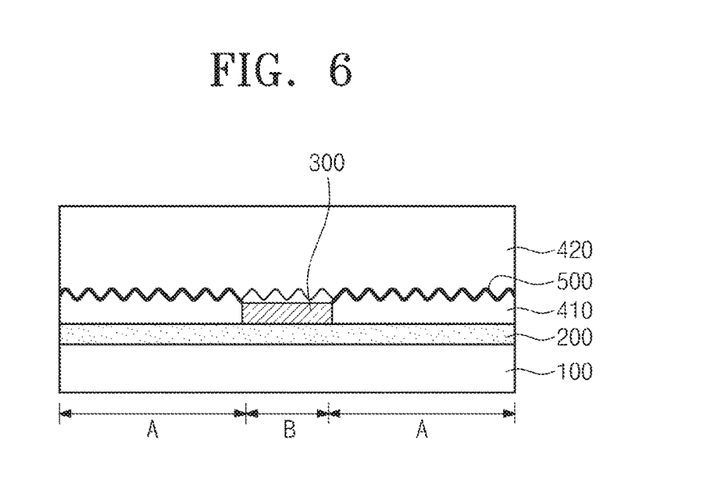

Referring to FIG. 6, a second elastic layer 420 may be formed on the first elastic layer 410. The second elastic layer 420 may completely cover the metal wirings 500 without a void. The second elastic layer 420 may be formed of a stretchable elastic material. As an example, the second elastic layer 420 may be formed of polydimethylsiloxane (PDMS) or polyurethane. An adhesive layer (not shown) may be further formed between the metal wirings 500 and the second elastic layer 420 so as to improve adhesive force between the metal wirings 500 and the second elastic layer 420.

Figure 7:
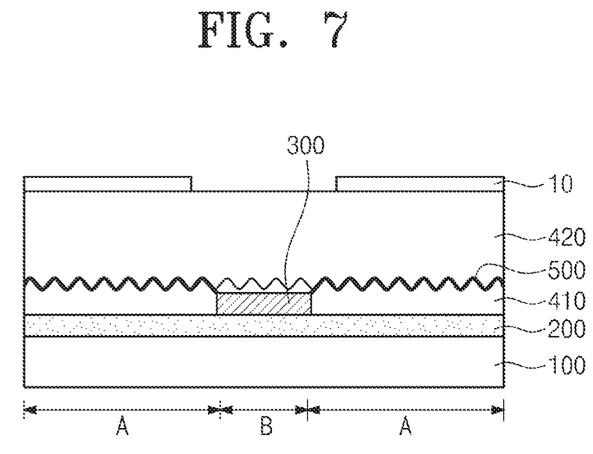
Figure 8:
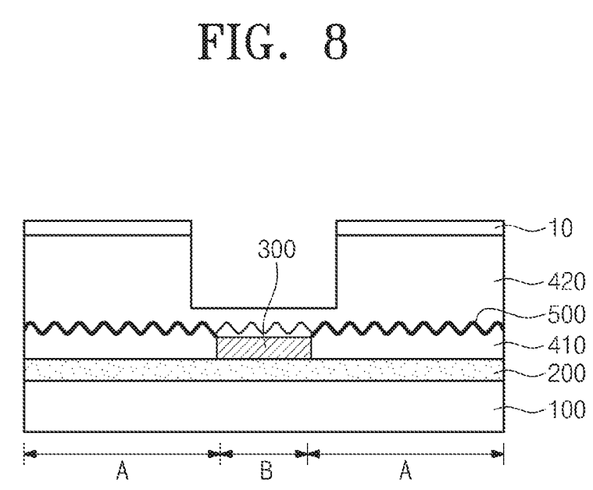

Referring to FIGS. 7 and 8, the second elastic layer 420 over the element region B and a portion of the wiring region A adjacent to the element region B may be partially etched. The etching of the second elastic layer 420 over the element region B and a portion of the wiring region A adjacent to the element region B may include forming a mask pattern 10 exposing a portion of the second elastic layer 420 on the second elastic layer 420 (FIG. 7), and an etching of a part of the second elastic layer 420 by using the mask pattern 10 as an etching mask (FIG. 8). The mask pattern 10 may expose the second elastic layer 420 of the element region B and a part of the second elastic layer 420 of the wiring region A adjacent to the element region B. After etching, a recess may be formed at the element region B of the second elastic layer 420 and a part of the wiring region A adjacent to the element region B. The recess may vertically overlap the electronic element 300, and have a width that is wider than that of the electronic element 300. After the recess is formed, the mask pattern may be removed.

Figure 9:
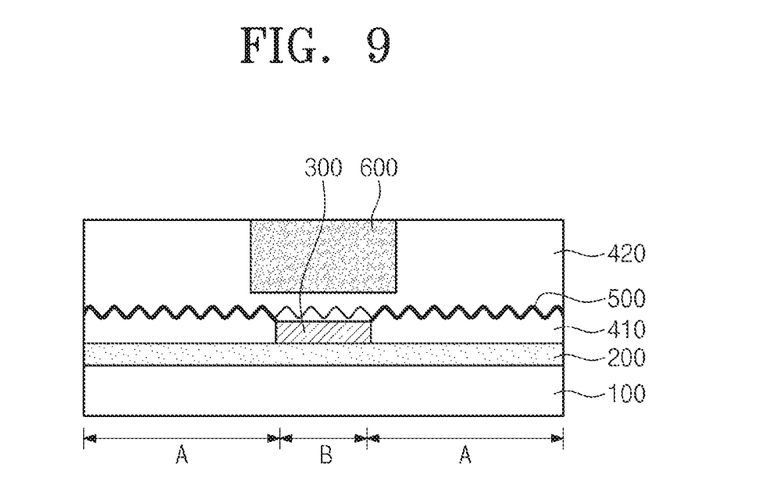

Referring to FIG. 9, the recess may be filled with a high rigidity material to form a high rigidity pattern 600. A material constituting the high rigidity pattern 600 may have a higher Young's modulus than that of a material constituting the elastic layer 410, and the second elastic layer 420, a third elastic layer (see 430 of FIG. 11) or an elastic substrate (see 440 of FIG. 13). As an example, the high rigidity pattern 600 may be formed of a polyimide.

Figure 14:
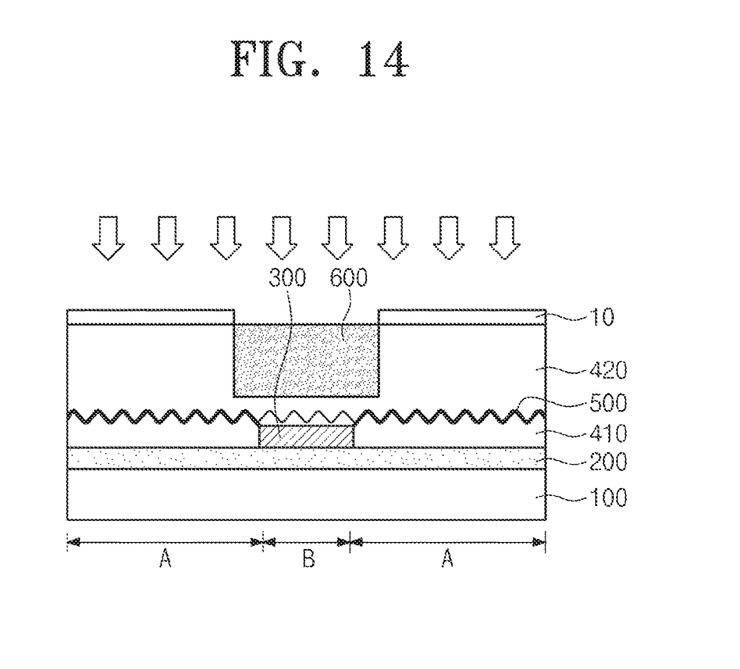

In accordance with another embodiments, as shown in FIG. 14, the forming of the high rigidity pattern 600 may include forming a mask pattern 10 exposing a portion of the second elastic layer 420 on the second elastic layer 420, irradiating light on the exposed second elastic layer 420, and removing the mask pattern 10. The second elastic layer 420 of the element region B and the portion of the second elastic layer 420 of the wiring region A adjacent to the element region B may be exposed by the mask pattern 10. In this embodiment, the second elastic layer 420 may be formed of a photosensitive elastic material. The photosensitive elastic material may have a portion on which light is irradiated, having a higher Young's modulus than a portion on which the light is not irradiated. As an example, the photosensitive elastic material may be a photosensitive polydimethylsiloxane.

Figure 10:
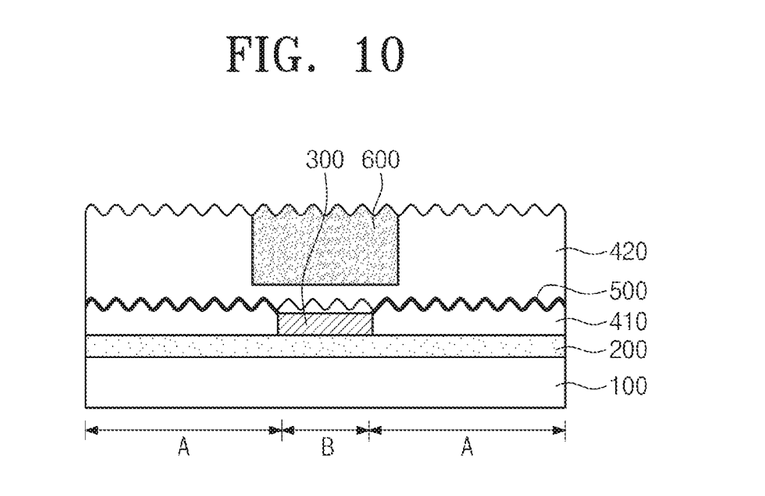

Referring to FIG. 10, the high rigidity pattern 600 may have a corrugated surface. The forming the surface of the high rigidity pattern 600 corrugated may be performed by the same method as the method of making the surface of the first elastic layer 410 corrugated described above. For convenience of a process, when the surface of the high rigidity pattern 600 is formed corrugated, the surface of the second elastic layer 420 may be also formed corrugated.

Figure 15:
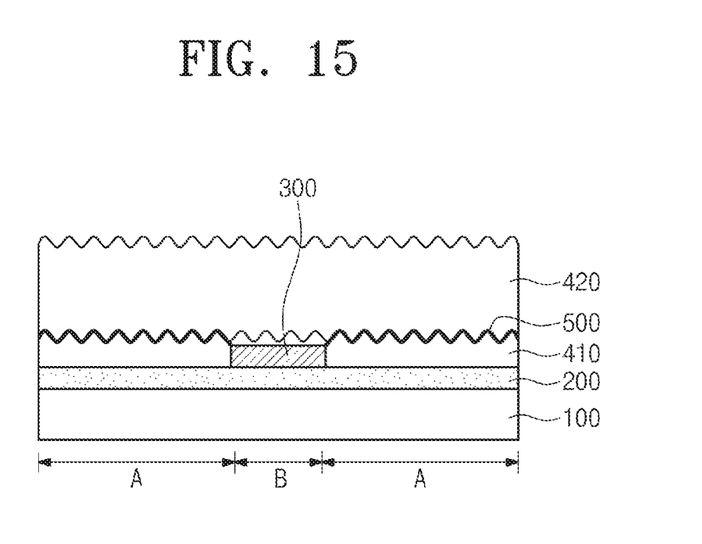
Figure 16:
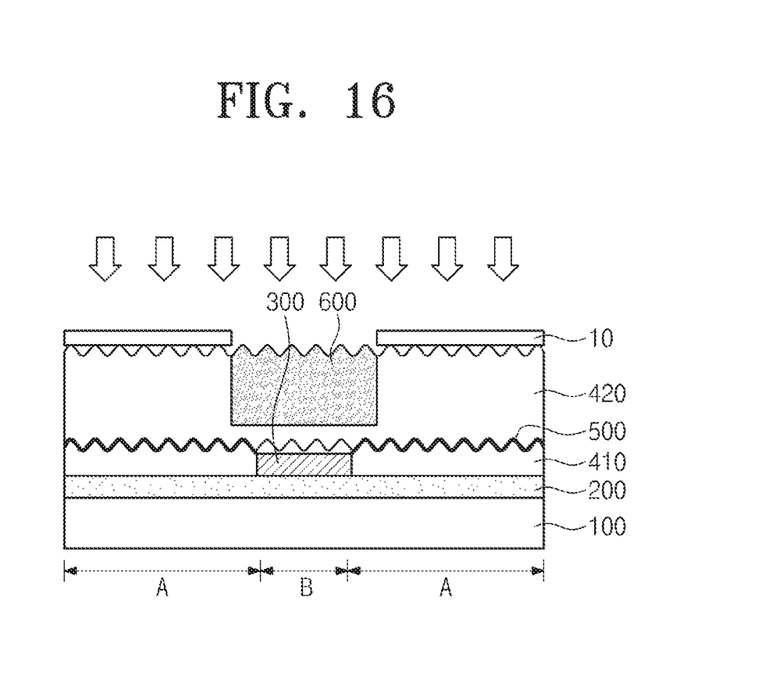

In accordance with another embodiment, as shown in FIGS. 15 and 16, the forming of the high rigidity pattern 600 having the corrugated surface may include making the surface of the second elastic layer 420 corrugated, forming the mask pattern 10 exposing a portion of the second elastic layer 420 on the second elastic layer 420, irradiating light on the exposed second elastic layer 420, and removing the mask pattern 10. The making the surface of the second elastic layer 420 corrugated may be performed by the same method as the method of making the surface of the first elastic layer 410 corrugated described above. The second elastic layer 420 of the element region and the portion of the second elastic layer 420 of the wiring region A adjacent to the element region B may be exposed by the mask pattern 10. In this embodiment, the second elastic layer 420 may be formed of a photosensitive elastic material. The photosensitive elastic material may have a portion on which the light is irradiated, having a higher Young's modulus than a portion on which the light is not irradiated. The photosensitive elastic material may be a photosensitive polydimethylsiloxane.

Figure 11:
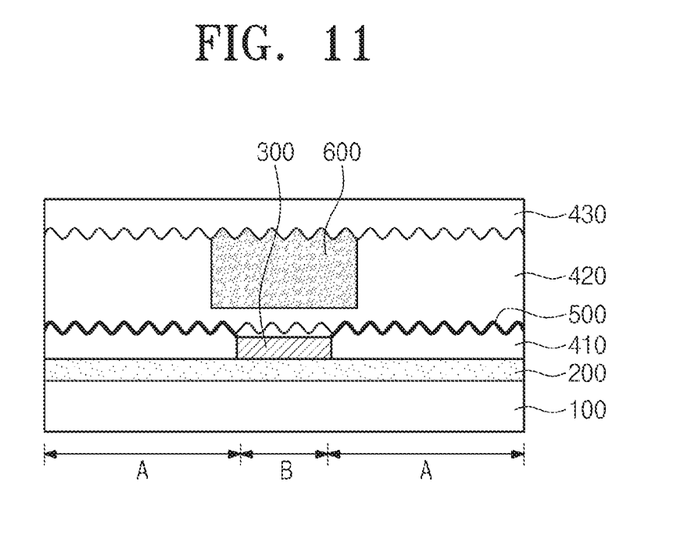

Referring to FIG. 11, a third elastic layer 430 may be formed on the second elastic layer 420 and the high rigidity pattern 600. The third elastic layer 430 may be formed of a stretchable elastic material. As an example, the third elastic layer 430 may be formed of polydimethylsiloxane (PDMS) or polyurethane. A surface treatment process and an adhesive layer (not shown) may be added so as to improve adhesive force between the high rigidity pattern 600 and the second elastic layer 420 or the third elastic layer 430.

Figure 12:
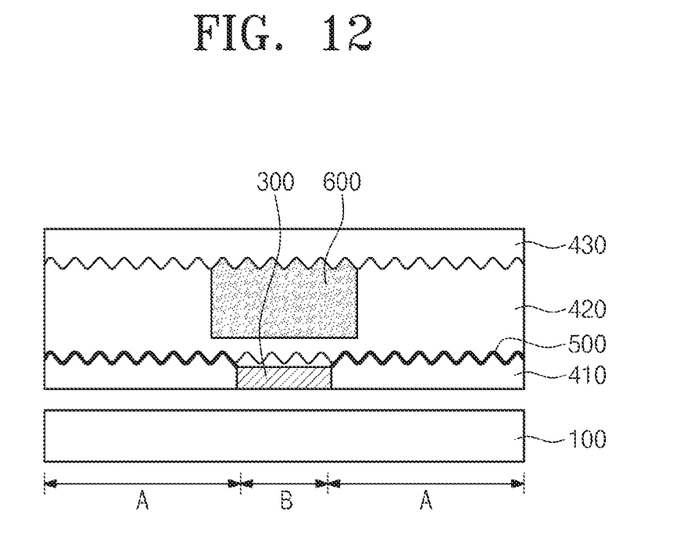

Referring to FIG. 12, the carrier substrate 100 may be separated by removing the sacrificial layer 200. The separating of the carrier substrate 100 may be performed by using any one selected from a high frequency heating process, a laser heating process, a chemical process or a physical process. As an example, the high frequency heating process may use a selective heating or a volume heating that is a main characteristic of the high frequency heating. A high frequency is irradiated into the sacrificial layer 200 from a point below the carrier substrate 100. The sacrificial layer 200 is selectively heated and decomposed through the irradiation, and thus separating the carrier substrate 100. In this case, the high frequency should be concentrated on the sacrificial layer 200 adjacent to the carrier substrate 100 such that the electronic element 300 is not affected by the high frequency. As another example, the using of the laser heating process employs the same principle as the high frequency heating except that a laser is used instead of the high frequency. As still another example, a chemical method may be used in which the electronic device is completely dipped in a chemical solution (for example, a hydrogen fluoride solution) to etch the sacrificial layer 200 (for example, an oxide). In this case, the chemical solution may be selected so as to minimize damages of the elastic layers 410, 420, and 430. As yet another example, a physical method may be used in which physical force is applied to the elastic layers 410, 420, and 430 in a state that the carrier substrate 100 is fixed to separate the carrier substrate 100. In this case, the sacrificial layer 200 may be formed of a material having a weak adhesive force to the carrier substrate. After the carrier substrate 100 is separated, the remaining sacrificial layer 200 may be removed using a chemical solution.

Figure 13:
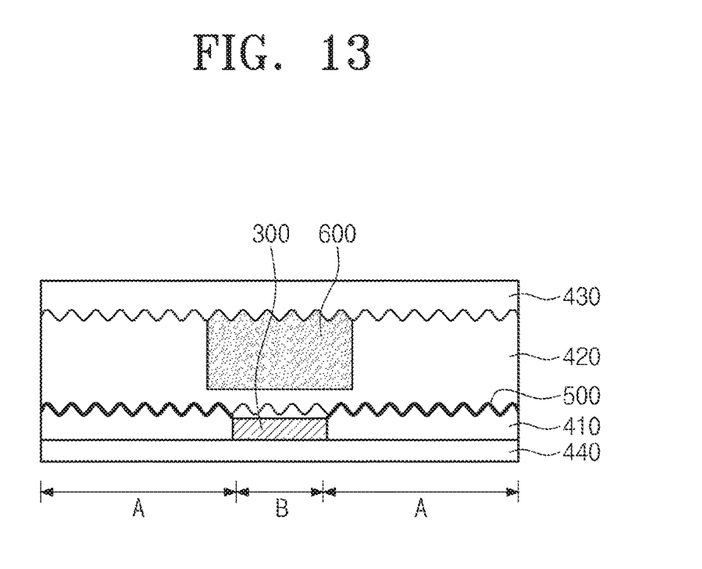

Referring to FIG. 13, after the carrier substrate 100 (reference numeral 100 of FIG. 12) is separated, an elastic substrate 440 may be formed on the exposed surface of electronic element 300 and the first elastic layer 410. The elastic substrate 440 may be formed of a stretchable elastic material. As an example, the elastic substrate 440 may be formed of polydimethylsiloxane (PDMS) or polyurethane.

Hereinafter, a method for fabricating an electronic device according to other embodiments of the present invention will be described with reference to FIGS. 17 to 20. Description duplicated with the foregoing description with respect to the methods of forming constituent elements and constituent materials will be omitted.

Figure 17:
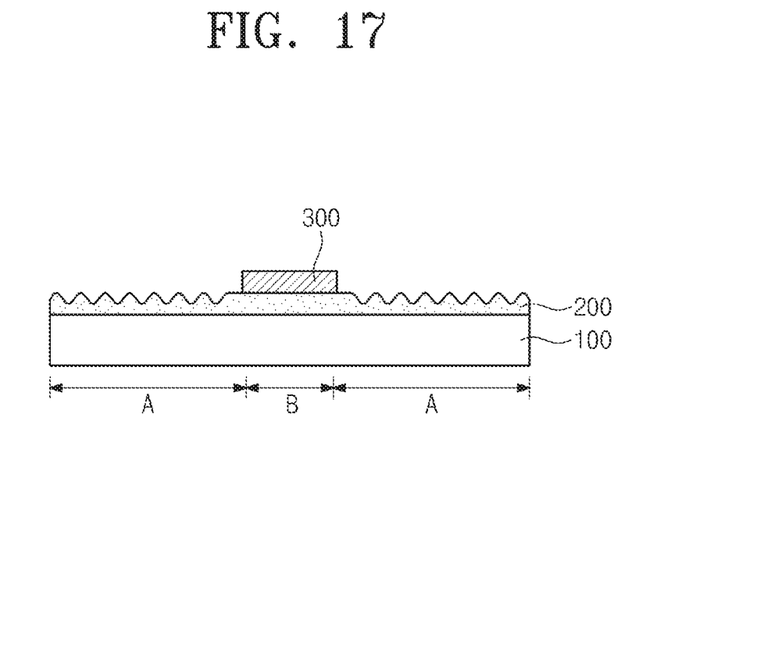

Referring to FIG. 17, a carrier substrate 100 may include a wiring region A and an element region B. A sacrificial layer 200 may be formed on the carrier substrate 100. An electronic element 300 may be formed on the sacrificial layer 200 of the element region B. A surface of the sacrificial layer 200 of the wiring region A may be formed corrugated. The making of the surface of the sacrificial layer 200 of the wiring region A corrugated may be performed by the same method as the making of the surface of the first elastic layer 410 corrugated described above.

Figure 18:
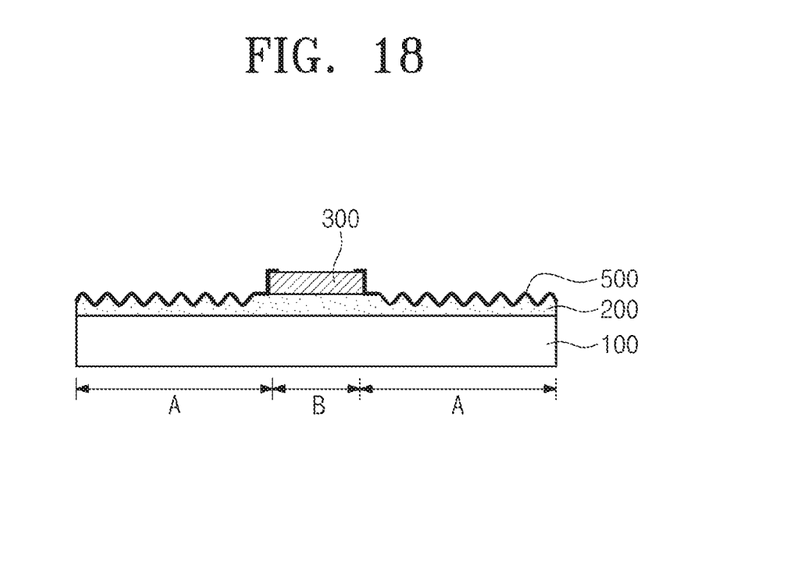

Referring to FIG. 18, metal wirings 500 may be formed on the sacrificial layer 200 of the wiring region A. The metal wirings 500 may be conformally formed on the corrugated surface of the sacrificial layer 200 without a void. The metal wirings 500 may electrically connect the electronic element 300. An adhesive layer (not shown) may be further formed between the metal wirings 500 and the sacrificial layer 200 so as to improve adhesive force between the metal wirings 500 and the sacrificial layer 200.

Figure 19:
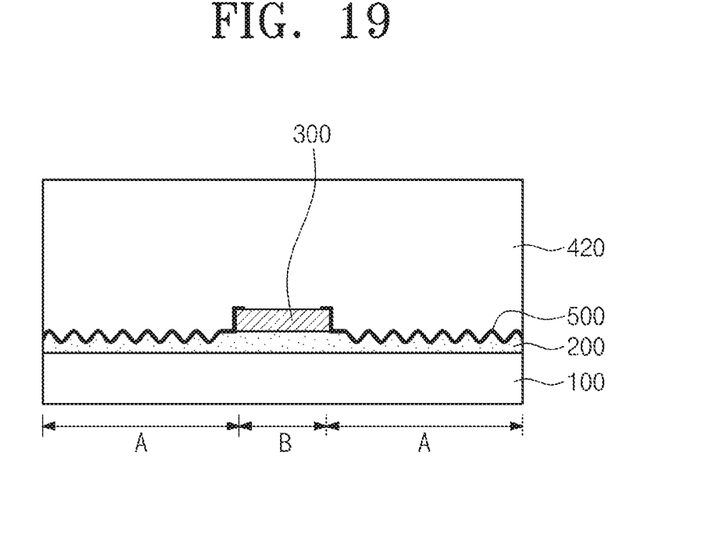

Referring to FIG. 19, a second elastic layer 420 may be formed on the sacrificial layer 200. The second elastic layer 420 may cover the metal wirings 500 without a void. The adhesive layer (not shown) may be further formed between the metal wirings 500 and the second elastic layer 420 so as to improve adhesive force between the metal wirings 500 and the second elastic layer 420.

Figure 20:
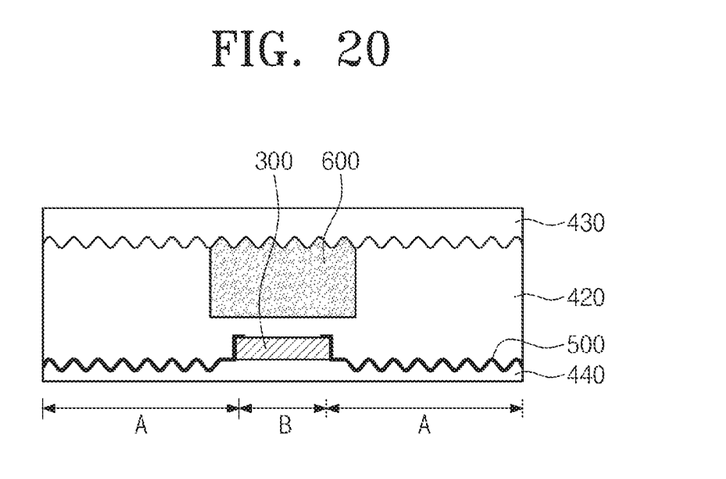

Referring to FIG. 20, a high rigidity pattern 600, a third elastic layer 430, and an elastic substrate 440 may be formed by the same method as the method described above with reference to FIGS. 7 to 16.

Figure 21:
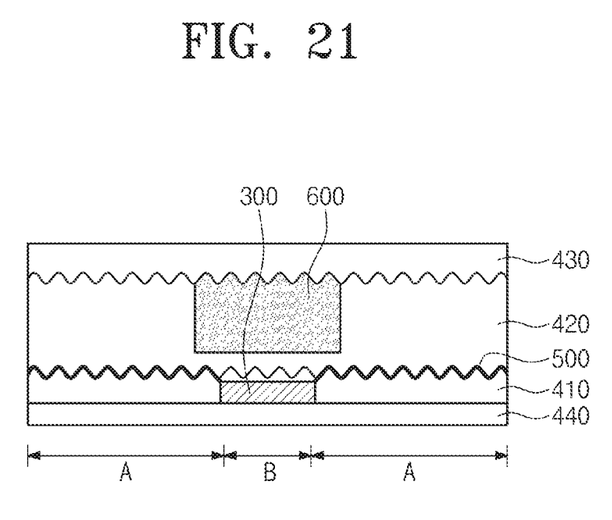
FIGS. 21 and 22 are cross-sectional views illustrating an electronic device according to embodiments of the present invention.
Figure 22:
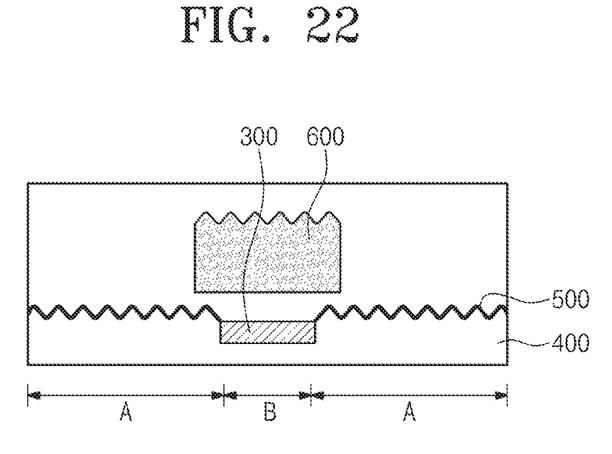

FIGS. 21 and 22 are cross-sectional views illustrating an electronic device according to embodiments of the present invention. Hereinafter, a structure of an electronic device according to embodiments of the present invention will be described. Description duplicated with the foregoing description with respect to the methods of forming constituent elements and constituent materials will be omitted.

Referring to FIG. 21, an electronic device according to an embodiment of the present invention may comprise an electronic element 300, a first elastic layer 410, a second elastic layer 420, a third elastic layer 430, an elastic substrate 440, metal wirings 500, and a high rigidity pattern 600.

The elastic substrate 440 may include a wiring region A and an element region B. The electronic element 300 may be disposed on the elastic substrate 440 of the element region B. The first elastic layer 410 may be disposed on the elastic substrate 440, and have a corrugated surface at the wiring region A. The metal wirings 500 may be disposed along the corrugated surface of the first elastic layer 410 of the wiring region A, and electrically connect the electronic element 300. The second elastic layer 420 may be disposed on the first elastic layer 410 to cover the metal wirings 500. The high rigidity pattern 600 may fill in the recess of the second elastic layer 420 and vertically overlap the electronic element 300. A surface of the high rigidity pattern 600 may be formed corrugated. The third elastic layer 430 may be disposed on the second elastic layer 420 and the high rigidity pattern 600.

A width of the high strength 600 may be wider than that of the electronic element 300. A material constituting the high rigidity patterns 600 may have a Young's modulus higher than that of a material constituting the first elastic layer 410, the second elastic layer 420, the third elastic layer 430, or the elastic substrate 440. As an example, the high rigidity pattern may be formed of a polyimide. As other example, the high rigidity pattern 600 may be formed by irradiating light on a portion of the second elastic layer 420 formed of a photosensitive elastic material. The photosensitive elastic material may have a portion on which light is irradiated, having a Young's modulus higher than that of a portion on which the light is not irradiated. As an example, the photosensitive elastic material may be a photosensitive polydimethylsiloxane.

An adhesive layer (not shown) may be further formed so as to improve adhesive force between the metal wirings 500 and the first elastic layer 410 or the second elastic layer 420, and the high rigidity region 600 and the second elastic layer 420 or the third elastic layer 430.

Referring to FIG. 22, the first elastic layer (reference numeral 410 of FIG. 21), the second elastic layer (reference numeral 420 of FIG. 21), the third elastic layer (reference numeral 430 of FIG. 21), and the elastic substrate (reference numeral 440 of FIG. 21) may be formed of the same material. In this case, the elastic layers (reference numeral 410, 420, and 430 of FIG. 21) and the elastic substrate (reference numeral 440 of FIG. 21) are not discriminated from each other, but may constitute one elastic layer 400.

In accordance with embodiments of the present invention, an electronic device having excellent performance may be implemented by using technologies established in an existing high temperature process as they are.

In accordance with embodiments of the present invention, an electronic device having improved elastic stability may be implemented by improving a structure of a region on which an electronic element and metal wirings are fabricated.

Further, while the present invention has been particularly shown and described with reference to exemplary embodiments thereof, it will be understood by those of ordinary skill in the art that various changes in form and details may be made therein without departing from the substantial features of the embodiments. For example, each element specifically appearing in the embodiment may be carried out through a modification. Therefore, embodiments described above are to be considered illustrative, and not restrictive.

What is claimed is:

1. A method for fabricating an electronic device, the method comprising:
    preparing a carrier substrate including an element region and a wiring region;
    forming a sacrificial layer on the carrier substrate;
    forming an electronic element on the sacrificial layer of the element region;
    forming a first elastic layer having a corrugated surface on the sacrificial layer of the wiring region;
    forming metal wirings electrically connecting the electronic element on the first elastic layer of the wiring region;
    forming a second elastic layer covering the metal wirings on the first elastic layer;
    forming a high rigidity pattern filling in a recess of the second elastic layer above the electronic element, vertically overlapping the electronic element, and having a corrugated surface;
    forming a third elastic layer on the second elastic layer and the high rigidity pattern; and
    separating the carrier substrate.

2. The method of claim 1, wherein the forming of the first elastic layer comprises:
    applying an elastic material on the sacrificial layer to cover the electronic element; and
    making a surface of the elastic material corrugated.

3. The method of claim 1, wherein the forming of the high rigidity pattern comprises:
    etching the second elastic layer of the element region and a part of the second elastic layer of the wiring region adjacent to the element region;
    filling the etched region of the second elastic layer with a high strength material; and
    making a surface of the high strength material corrugated.

4. The method of claim 1, wherein the second elastic layer is formed of a photosensitive elastic material.

5. The method of claim 4, wherein the forming of the high rigidity pattern comprises;
    forming a mask pattern exposing the second elastic layer of the element region and a part of the second elastic layer of the wiring region adjacent to the element region, on the second elastic layer;
    irradiating light on the second elastic layer exposed by the mask pattern; and
    making a surface of the second elastic layer exposed to light corrugated.

6. The method of claim 4, wherein the forming of the high rigidity pattern comprises:
    making a surface of the second elastic layer corrugated;
    forming a mask pattern exposing the second elastic layer of the element region and a part of element region of the wiring region adjacent to the element region, on the second elastic layer; and
    irradiating light on the second elastic layer exposed by the mask pattern.

7. The method of claim 1, wherein a width of the high rigidity pattern is wider than that of the electronic element.

8. The method of claim 1, wherein the separating of the carrier substrate is performed by using any one selected from a high-frequency heating process, a laser heating process, a chemical process or a physical process.

9. The method of claim 1, further comprising a forming of an elastic substrate on the electronic element and the first elastic layer that are exposed after separating the carrier substrate.

* * * * *